US009673706B2

(12) United States Patent
Matsuki et al.

(10) Patent No.: US 9,673,706 B2
(45) Date of Patent: Jun. 6, 2017

(54) BUCK DC/DC CONVERTER AND CONTROL IC THEREOF, COMMUNICATION MACHINE FOR OFFICE, ELECTRIC BICYCLE

(71) Applicant: ROHM CO., LTD., Ukyo-ku, Kyoto (JP)

(72) Inventors: Takeru Matsuki, Kyoto (JP); Shinya Karasawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/833,440

(22) Filed: Aug. 24, 2015

(65) Prior Publication Data

US 2016/0065071 A1    Mar. 3, 2016

(30) Foreign Application Priority Data

Aug. 28, 2014   (JP) ................................. 2014-174618

(51) Int. Cl.
| | |
|---|---|
| H02M 3/158 | (2006.01) |
| H01L 23/00 | (2006.01) |
| H02M 1/08 | (2006.01) |
| H02M 1/32 | (2007.01) |
| H02M 1/00 | (2006.01) |

(52) U.S. Cl.
CPC ............ *H02M 3/158* (2013.01); *H01L 23/00* (2013.01); *H02M 1/08* (2013.01); *H02M 1/32* (2013.01); *H01L 2924/0002* (2013.01); *H02M 2001/0006* (2013.01)

(58) Field of Classification Search
CPC .......... H02M 3/158; H02M 1/32; H02M 1/08; H02M 2001/0006; H01L 23/00; H01L 2924/0002

USPC ........................................................ 323/268
See application file for complete search history.

(56) References Cited

U.S. PATENT DOCUMENTS

| | | | | |
|---|---|---|---|---|
| 5,726,635 A | * | 3/1998 | Tsuhara | H05K 7/1459 200/51.09 |
| 6,928,560 B1 | * | 8/2005 | Fell, III | G06F 1/206 307/43 |
| 7,724,046 B2 | * | 5/2010 | Wendt | H03K 17/6872 327/110 |
| 7,923,807 B2 | * | 4/2011 | Nakamura | H01L 21/763 257/505 |

(Continued)

FOREIGN PATENT DOCUMENTS

| | | | |
|---|---|---|---|
| JP | 59-223093 A | * | 12/1984 |
| JP | 2009095214 A | | 4/2009 |
| JP | 2011211020 A | | 10/2011 |

OTHER PUBLICATIONS

Received search report from STIC EIC 2800 searcher Benjamin Martin on Sep. 14, 2016.*

*Primary Examiner* — Gustavo Rosario Benitez
*Assistant Examiner* — Htet Z Kyaw
(74) *Attorney, Agent, or Firm* — Cantor Colburn LLP (57) ABSTRACT

The present invention relates to improving the reliability of the control IC of DC/DC converters. The present invention provides a control IC 200 of a rectifier diode-type buck DC/DC converter 100. An N-channel DMOS switch transistor M1 is disposed between an input terminal VCC and a switch terminal LX. A first diode D11 and an N-channel DMOS low-side transistor M2 are connected in series with and disposed between the switch terminal LX and a ground terminal GND.

13 Claims, 7 Drawing Sheets

(56) References Cited

U.S. PATENT DOCUMENTS

| | | | | |
|---|---|---|---|---|
| 8,270,133 B2* | 9/2012 | Nakahara | ............ | H03K 17/063 307/127 |
| 8,638,534 B2* | 1/2014 | Nakahara | ............ | H03K 17/063 307/127 |
| 9,369,038 B2* | 6/2016 | Sakai | ............ | H02M 3/156 |
| 2003/0042967 A1* | 3/2003 | Middel | ............ | H03K 17/6871 327/424 |
| 2004/0036458 A1* | 2/2004 | Johnson | ............ | H02M 3/158 323/282 |
| 2004/0141341 A1* | 7/2004 | Higashitani | ......... | H02M 3/1582 363/59 |
| 2005/0237772 A1* | 10/2005 | Batarseh | ............ | H02M 3/335 363/89 |
| 2008/0094866 A1* | 4/2008 | Bauman | ............ | H02M 1/34 363/50 |
| 2009/0154041 A1* | 6/2009 | Nakahara | ............ | H03K 17/063 361/84 |
| 2010/0013451 A1* | 1/2010 | Nakamura | ............ | H02M 3/1588 323/282 |
| 2011/0018515 A1* | 1/2011 | McCloy-Stevens | | H02M 3/1588 323/284 |
| 2012/0069560 A1* | 3/2012 | Miskin | ............ | H05B 33/0821 362/227 |
| 2012/0099232 A1* | 4/2012 | Kuroyabu | ............ | H01L 27/0266 361/56 |
| 2012/0113687 A1* | 5/2012 | Wildrick | ............ | H02M 3/3378 363/21.02 |
| 2013/0082604 A1* | 4/2013 | Williams | ............ | H05B 33/0884 315/130 |
| 2013/0127371 A1* | 5/2013 | Sarig | ............ | H02M 1/36 315/307 |
| 2016/0011610 A1* | 1/2016 | Hayashi | ............ | H02M 3/1588 348/730 |

* cited by examiner

BUCK DC/DC CONVERTER AND CONTROL IC THEREOF, COMMUNICATION MACHINE FOR OFFICE, ELECTRIC BICYCLE

CROSS REFERENCE TO RELATED APPLICATIONS

The present invention claims priority under 35 U.S.C. §119 to Japanese Application No. 2014-174618, filed Aug. 28, 2014, the entire content of which is incorporated herein by reference.

BACKGROUND

The present disclosure relates to a direct current to direct current (DC/DC) converter.

In an electronic machine or system that is supplied with a power supply voltage $V_{CC}$ with a certain voltage level, a buck DC/DC converter is used when the operation voltage of the internal circuit is lower than the power supply voltage $V_{CC}$.

Figure 1:
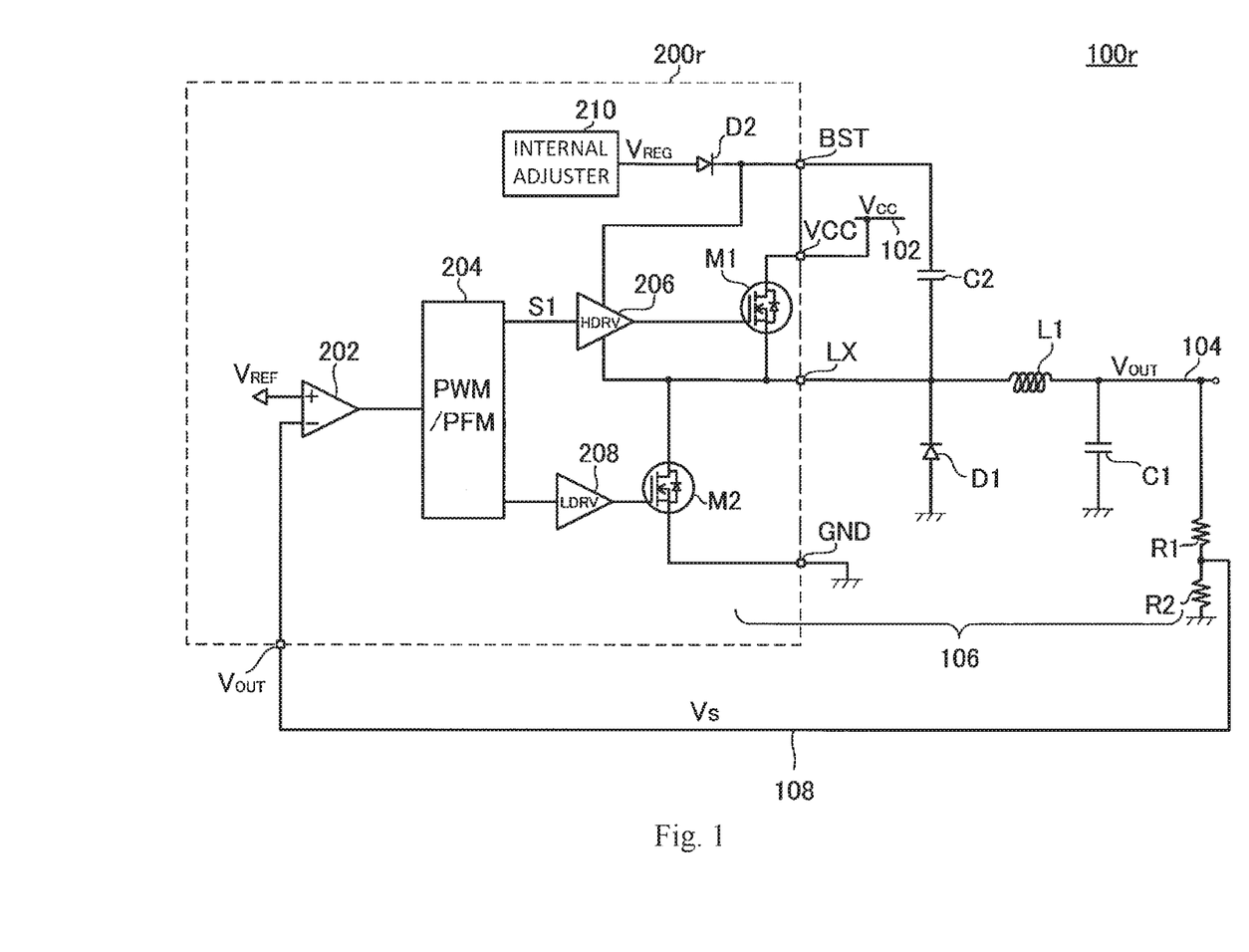
FIG. 1 is a circuit diagram illustrating a buck DC/DC converter investigated by the present inventors.

FIG. 1 is a circuit diagram of a buck DC/DC converter investigated by the present inventors. The DC/DC converter 100r receives the input voltage (power supply voltage) $V_{CC}$ from the input line 102, reduces the input voltage and then stabilizes the reduced voltage to generate an output voltage $V_{OUT}$ having a specific target voltage level, which is supplied to a load (not shown in the drawing) connected with the output line 104.

The DC/DC converter 100r comprises an output circuit 106 and a control integrated circuit (control IC) 200r. The DC/DC converter 100r is a rectifier diode-type converter, and the output circuit 106 comprises a switch transistor M1, a rectifier diode D1, an inductor L1, and an output capacitor C1.

The control IC 200r comprises an input terminal (VCC), a switch terminal (LX terminal), a ground terminal (GND), and a bootstrap terminal (BST). When disposing (integrating) the switch transistor M1 in the control IC 200r, the N-channel MOSFET (Metal Oxide Semiconductor Field Effect Transistor) is used in order to reduce the size of the circuit. The drain of the switch transistor M1 is connected with the VCC terminal, while the source of the switch transistor M1 is connected with the LX terminal.

The output voltage $V_{OUT}$ is divided by resistors R1 and R2, and fed back to the voltage detection terminal (VOUT) of the control IC 200r via the feedback line 108. The error amplifier 202 amplifies the error between the fed-back detection voltage $V_S$ and a specific reference voltage $V_{REF}$. The duty cycle controller 204 comprises a pulse width modulator or a pulse frequency modulator, or a combination of the two; it generates a pulse signal S1 by modulating the duty cycle ratio as though the error is close to zero. The high-side driver 206 switches on or off the switch transistor M1 according to the pulse signal S1.

In order to conduct the switch transistor M1 for use as the N-channel MOSFET, the high-side driver 206 has to apply to the gate of the switch transistor M1 a driving voltage $V_H$, which is higher than the power supply voltage $V_{CC}$. A bootstrap circuit is used to generate the driving voltage $V_H$.

The bootstrap circuit comprises a bootstrap capacitor C2, a diode D2, a low-side transistor M2, a low-side driver 208, and an internal adjuster 210. The internal adjuster 210 comprises a linear regulator for receiving the power supply voltage $V_{CC}$ and reducing the voltage of thereof, and generating a stabilized, internal voltage $V_{REG}$. The diode D2 is disposed between the output terminal of the internal adjuster 210 and the BST terminal. The bootstrap capacitor C2 is disposed between the LX terminal and the BST terminal.

The low-side transistor M2 is disposed between the LX terminal and the GND terminal. The duty cycle controller 204 generates a control signal S2 of the low-side transistor M2 synchronously with the pulse modulation signal S1. The control signal S2 is generated by conducting the low-side transistor M2 during at least a portion of the turn-off period of the switch transistor M1.

When the switch transistor M1 is switched off and the low-side transistor M2 is conducted, the potential of the LX terminal is zero V. At this time, one terminal (the BST terminal) of the bootstrap capacitor C2 is charged by the internal adjuster 210 via the diode D2. The power source terminal at the high side of the high-side driver 206 is supplied with the voltage of the BST terminal.

In this case, in the application where the input power supply voltage $V_{CC}$ is preferably about 48 V at maximum, a high-voltage element capable of handling voltages up to 60 V is used as the switch transistor M1 or the low-side transistor M2; one example of the above-mentioned high-voltage element is a DMOS (Double-Diffused MOSFET) having the double-diffused MOS structure.

Figure 2:
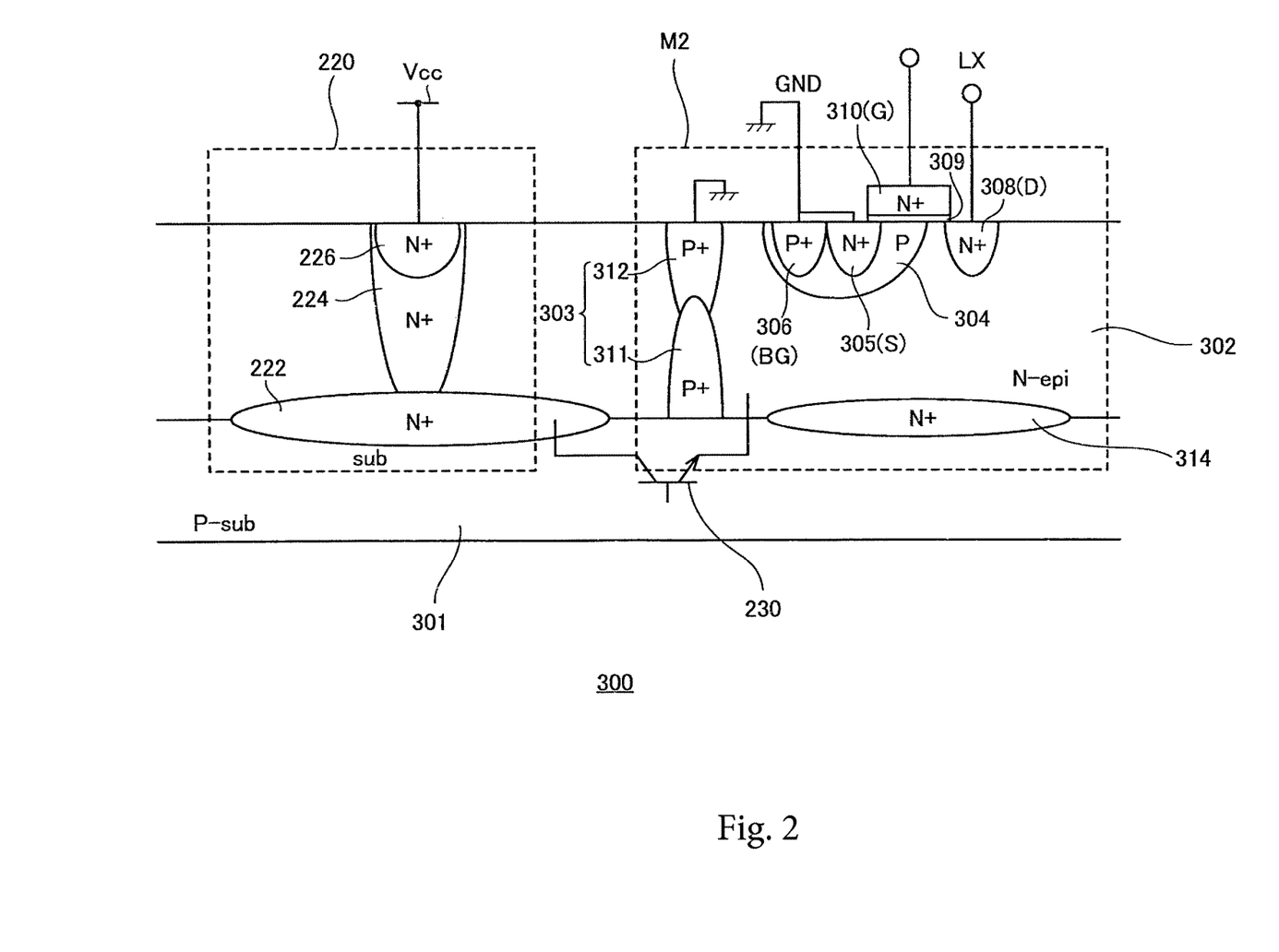
FIG. 2 is a cross-sectional view of a semiconductor device having the DMOS structure.

FIG. 2 is a cross-sectional view of a semiconductor device 300 having the DMOS structure. An N-type epitaxial layer 302 for use as the semiconductor layer and a P-type isolating diffusion region 303 surrounding the peripheral (lateral) ring of the N-type epitaxial layer 302 and for use as the isolating region are formed on the P-type semiconductor substrate 301. A P-type body diffusion region 304 for use as the body region is formed on the surface layer portion of the N-type epitaxial layer 302. An N-type source diffusion region 305 for use as the source region and a P-type body contact region 306 are also formed on the surface layer portion of the P-type body diffusion region 304. The N-type source diffusion region 305 and the P-type body contact region 306 are connected to the ground. A drain diffusion region 308 for use as the drain region is formed on the surface layer portion of the N-type epitaxial layer 302. An oxide film layer 309 is formed on the gate region at the surface of the N-type epitaxial layer 302; a gate electrode 310(G) is formed on the oxide film layer 309. An N-type embedded diffusion layer 314 is formed at the injunction of the P-type semiconductor substrate 301 and the N-type epitaxial layer 302.

The P-type isolating diffusion region 303 comprises, a low-side isolating diffusion region 311 connected to the lower side of the P-type semiconductor substrate 301 and a high-side isolating diffusion region 312 formed on the low-side isolating diffusion region 311. The high-side isolating diffusion region 312 is connected to the ground, and the potential of the P-type semiconductor substrate 301 is fixed to the grounding voltage (0 V).

Regarding the DMOS for use as the low-side transistor M2, the drain (D) thereof is connected with the LX terminal, while the source (S) thereof is connected with the GND terminal. The periphery of the low-side transistor M2 is surrounded by a guard ring 220 having a vertical N-well structure. The guard ring 220 comprises an N-type embedded diffusion layer 222, a diffusion region 224 disposed on the N-type embedded diffusion layer 222, and a contact region 226. The contact region 226 is fixed to the power supply voltage $V_{CC}$.

PATENT LITERATURE

Japanese patent laid-open publication No. 2009-095214 and No. 2011-211020

BRIEF SUMMARY OF THE INVENTION

Problems to be Solved in the Present Invention

The present inventors investigate the semiconductor devices 300 having the elements and features illustrated in FIG. 2, and recognize the problems as follows.2

The N-type epitaxial layer 302 of the low-side transistor M2, the P-type semiconductor substrate 301, and the N-type embedded diffusion layer 222 of the guard ring 220 form a parasitic bipolar transistor (NPN-type) 230.

Returning to FIG. 1. In the application where the input power supply voltage $V_{CC}$ is preferably about 48 V at maximum, the rectifier diode D1 is also required to be a high-voltage element. Generally, the forward voltage Vf of a high-voltage diode element is greater than the forward voltage Vf of a low-voltage diode. In one example, the forward voltage Vf of the high-voltage rectifier diode D1 is set as 0.9 V, which is greater than the forward voltage of the low-voltage diode of about 0.7 V.

Regarding the parasitic transistor 230. The emitting electrode of the parasitic transistor 230 is connected with the LX terminal, and the base electrode of the parasitic transistor 230 is connected with the P-type semiconductor substrate 301. As described above, the potential of the P-type semiconductor substrate 301 is zero V. Further, during the turn-off period of the switch transistor M1, the current flows from the anode to the cathode of the rectifier diode D1. At this time, the potential of the LX terminal becomes −Vf=−0.9 V. That is, the voltage between the base electrode and the emitting electrode of the parasitic transistor 230 becomes 0.9 V.

If the voltage Vbe between the base electrode and the emitting electrode of the parasitic transistor 230 is set to 0.7 V, the parasitic transistor 230 is switched on during the turn-off period of the switch transistor M1. In this case, the following possibility may arise: heavy current flows from the power supply line, the guard ring 220 and the parasitic transistor 230 to the N-type epitaxial layer 302, thereby adversely affecting the reliability of the device. Furthermore, this problem should not be construed as one commonly recognized by persons having ordinary skill in the art.

The present invention is provided in view of the foregoing technical problem, and one exemplified purpose of one aspect of the present disclosure is to provide a control IC 200 of the DC/DC converter with improved reliability.

Technical Means for Solving Problems

One aspect of the present invention is directed to a control IC (integrated circuit) of a rectifier diode-type buck DC/DC converter. The control IC comprises: an input terminal, configured to receive an input voltage; a switch terminal, connected with the inductor and connected with the cathode of the rectifier diode; a ground terminal, connected with the anode of the rectifier diode; an N-channel DMOS switch transistor, disposed between the input terminal and the switch terminal; a first diode and an N-channel DMOS low-side transistor, connected in series with and disposed between the switch terminal and a ground terminal; a high-side driver, configured to switch the switch transistor; and a low-side driver, configured to switch the low-side transistor.

According to the above-mentioned aspect, by inserting the first diode between the switch terminal and the ground terminal, there is no need to surround the periphery of the low-side transistor with a guard ring. In this way, the parasitic transistor formed from the input terminal, the substrate, and the switch terminal parasitic transistor no longer exists; hence, even if the potential of the switch terminal significantly shifts toward the negative direction, it is possible to inhibit the flow of heavy current to the low-side transistor, thereby increasing the reliability of the device.

In one aspect, it is feasible to use a rectifier diode with a greater forward voltage. In this way, the cost of the buck DC/DC converter may be reduced.

The first diode may also comprise a P-channel DMOS transistor, which has a gate and back-gate that are connected with the drain of the low-side transistor.

The first diode is also manufactured such that the semiconductor substrate for use in the integration of the control IC comprises no parasitic element.

Also, the first diode can be disposed at a position that is closer to the high side than the low-side transistor is.

The control IC according to one aspect of the present invention may further comprise a bootstrap terminal; an internal adjuster, configured to generate an internal voltage with a specific voltage level; and a second diode, disposed between the output terminal of the internal adjuster and the bootstrap terminal. It is also configured to supply the voltage of the bootstrap terminal to the power terminal of the high side of the high-side driver.

The control IC is also configured to receive, at the input terminal thereof, an input voltage greater than 24-V series.

The control IC according to one aspect of the present invention may further comprise: a detection terminal, which is inputted with a detection voltage that is corresponding to the output voltage of the buck DC/DC converter; an error amplifier, configured to amplify an error between the detection voltage and a specific reference voltage and generate an error signal; and a duty cycle controller, configured to receive the error signal and generates a pulse modulation signal by modulating the duty cycle ratio as though the error is close to zero.

Another aspect of the present invention is also directed a control IC of a rectifier diode-type buck DC/DC converter. The control IC comprises: an input terminal, configured to receive an input voltage; a switch terminal, connected with the inductor and connected with the cathode of the rectifier diode; a ground terminal, connected with the anode of the rectifier diode; an N-channel DMOS switch transistor, disposed between the input terminal and the switch terminal; an N-channel DMOS low-side transistor, in which the source thereof is connected with a ground terminal; a voltage limiting element, inserted between the switch terminal and the drain of the low-side transistor, and configured to inhibit the drain voltage of the low-side transistor from shifting toward the negative direction; a high-side driver, configured to switch the switch transistor; and a low-side driver, configured to switch the low-side transistor.

According to the above-described aspect, by inserting the voltage limiting element, it is feasible to inhibit the drain of the low-side transistor from having a negative potential, and hence, there is no need to surround the periphery of the low-side transistor with the guard ring. In this way, the parasitic transistor formed from the input terminal, the substrate and the switch terminal disappears; in this case, even if the potential of the switch terminal significantly shifts toward the negative direction, it is feasible to inhibit the flow of heavy current to the low-side transistor, thereby increasing the reliability of the device.

The voltage limiting element may also comprise a first diode. The voltage limiting element may also comprise a P-channel DMOS transistor which has a gate and back-gate that are connected to the drain of the low-side transistor. The voltage limiting element may also comprise a floating MOSFET.

Also, the voltage limiting element may be manufactured such that the semiconductor substrate for use in the integration of the control IC comprises no parasitic element.

Another aspect of the present invention is directed to a rectifier diode-type buck DC/DC converter. The buck DC/DC converter comprises: the control IC according to any of the above-mentioned aspects/examples of this invention; an output line that is connected with a load; a rectifier diode, disposed between the switch terminal and the ground terminal of the control IC; an output capacitor, connected with the output line; and an inductor, disposed between the output line and the switch terminal.

Another aspect of the present invention is directed to a communication machine for office or an electric bicycle. The communication machine for office or electric bicycle comprises the above-mentioned buck DC/DC converter.

Further, any combinations of the above-described constituting elements, or the implementations of the constituting elements of the present invention in a method, device, or system, also fall within the scope of the embodiments of the present invention.

Effects of the Present Invention

According to one aspect of the present invention, the reliability of a control IC is increased.

DETAILED DESCRIPTION

The present invention is described hereinbelow based on preferred embodiments thereof by referencing to the appended drawings. Like or equivalent constituting elements, components and processes across various drawings are designated with the same or similar reference symbols, and repeated description thereof may be omitted where suitable. Also, the embodiments are provided for illustrative purposes and should not be construed to limit the scope of the claimed invention, while not all the features or combinations thereof are necessarily the essence of the claimed invention.

In this specification, the description regarding the status that "a component A is connected with/to a component B" includes not only the physical and direct connection between the component A and the component B, but also the indirect connection between the component A and the component B; as long as such indirect connection does not substantially affect the electric connection status therebetween or the functionality attained by such connection.

Similarly, the description regarding the status that "a component C is disposed between a component A and a component B" includes not only the physical and direct connection between the component A and the component C or between the component B and the component C, but also the indirect connection therebetween; as long as such indirect connection does not substantially affect the electric connection status therebetween or the functionality attained by such connection.

Figure 3:
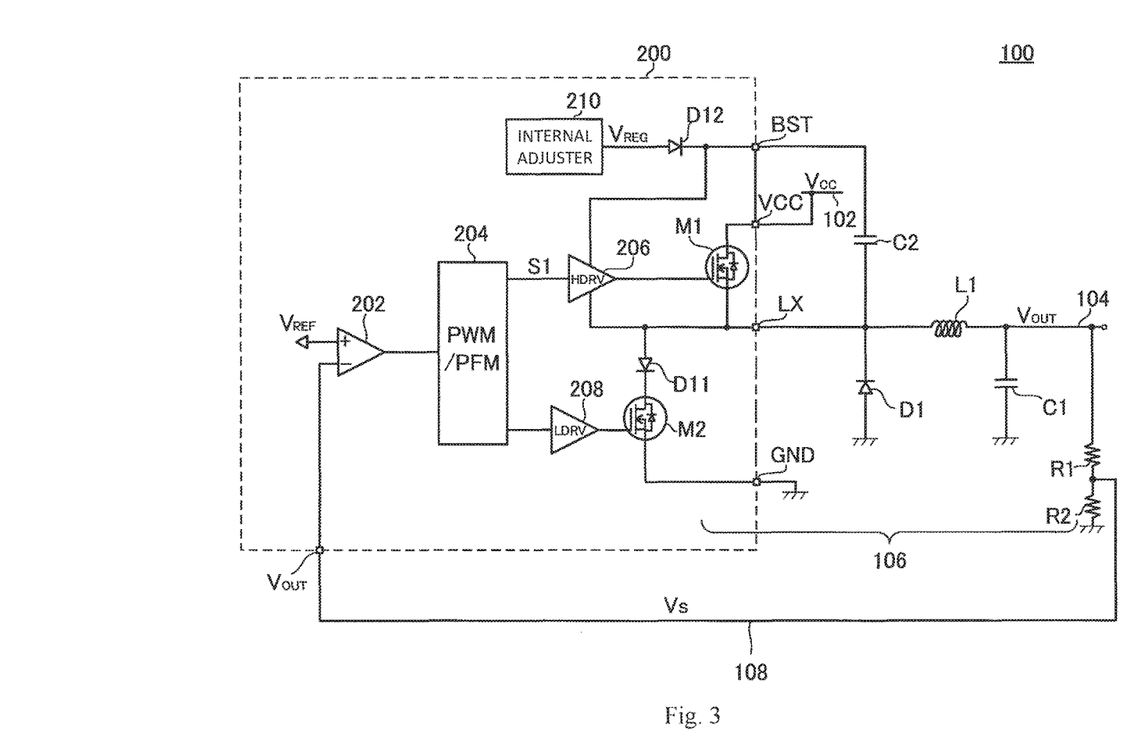
FIG. 3 is a circuit diagram illustrating a buck DC/DC converter according to embodiments of the present invention.

FIG. 3 is a circuit diagram of a buck DC/DC converter 100 according to one embodiment of the present disclosure. The DC/DC converter 100 receives an input voltage (power supply voltage) $V_{CC}$ from the input line 102, reduces the input voltage and then stabilizes the reduced voltage to generate an output voltage $V_{OUT}$ having a specific target voltage level, which is supplied to a load (not shown in the drawing) connected with the output line 104. The basic structure of the DC/DC converter 100 is substantially the same as that of the DC/DC converter in FIG. 1, and hence, a detailed description regarding the same is omitted.

The control IC 200 according to one of the present embodiments comprises an input terminal (VCC), a switch terminal (LX terminal), a ground terminal (GND), and a bootstrap terminal (BST) for use as the input/output pin. Also, the control IC 200 comprises therein a switch transistor M1, a low-side transistor M2, a first diode D11, a second diode D12, an error amplifier 202, a duty cycle controller 204, a high-side driver 206, a low-side driver 208, and an internal adjuster 210; these elements constitute a single package. It is also feasible to integrate the constituting elements of the control IC 200 on a single semiconductor substrate. Alternatively, in the case where the manufacturing process of the power-based element(s) differs from that of the electricity-based element(s), it is also feasible to integrate said elements individually on a plurality of semiconductor substrates.

The error amplifier 202, duty cycle controller 204, high-side driver 206, low-side driver 208, internal adjuster 210, and second diode D12 of the control IC 200 have been described above in connection with FIG. 1.

In addition to the control IC 200r illustrated in FIG. 1, the control IC 200 further comprises the first diode D11. The low-side transistor M2 is an N-channel DMOS (hereinbelow, NDMOS) transistor. In the present embodiment, the first diode D11 and the low-side transistor M2 are connected in series with and disposed between the LX terminal and the GND terminal. The first diode D11 is inserted at a position that is closer to the high side (i.e., the LX terminal side) than the low-side transistor M2 is.

Figure 4:
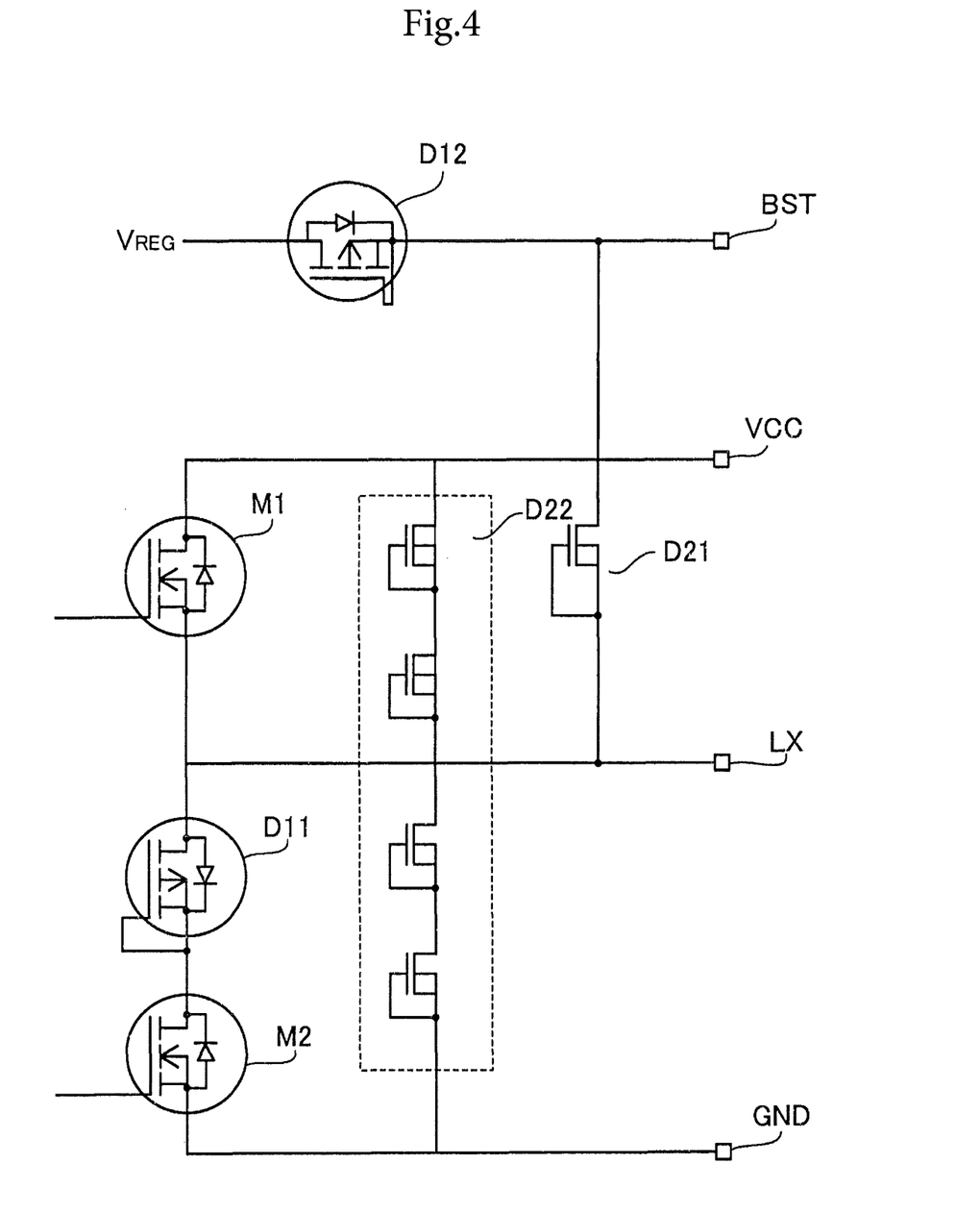
FIG. 4 is circuit diagram illustrating the output section of the present control IC.

FIG. 4 is the circuit diagram of the output section of the control IC 200. For example, the first diode D11 comprises a P-channel MOS transistor (also referred to as PMOS transistor). The gate and back-gate (body) of the PMOS transistor are connected with the drain of the low-side transistor M12. Hence, the cathode of the body diode of the first diode D11 is connected with the drain of the low-side transistor M2, while the anode of the body diode is connected with the LX terminal.

Similar to the first diode D11, the second diode D12 can be made from a PMOS transistor. A diode D21 is inserted between the BST terminal and the LX terminal for the purpose of protection. Further, a diode D22 is inserted between the VCC terminal and the GND terminal for the purpose of protection. The number of the segments of the diodes D21 and D22 may be determined depending solely on the voltage level applied to each terminal. These protective diodes are made from the N-channel MOSFET.

Figure 5:
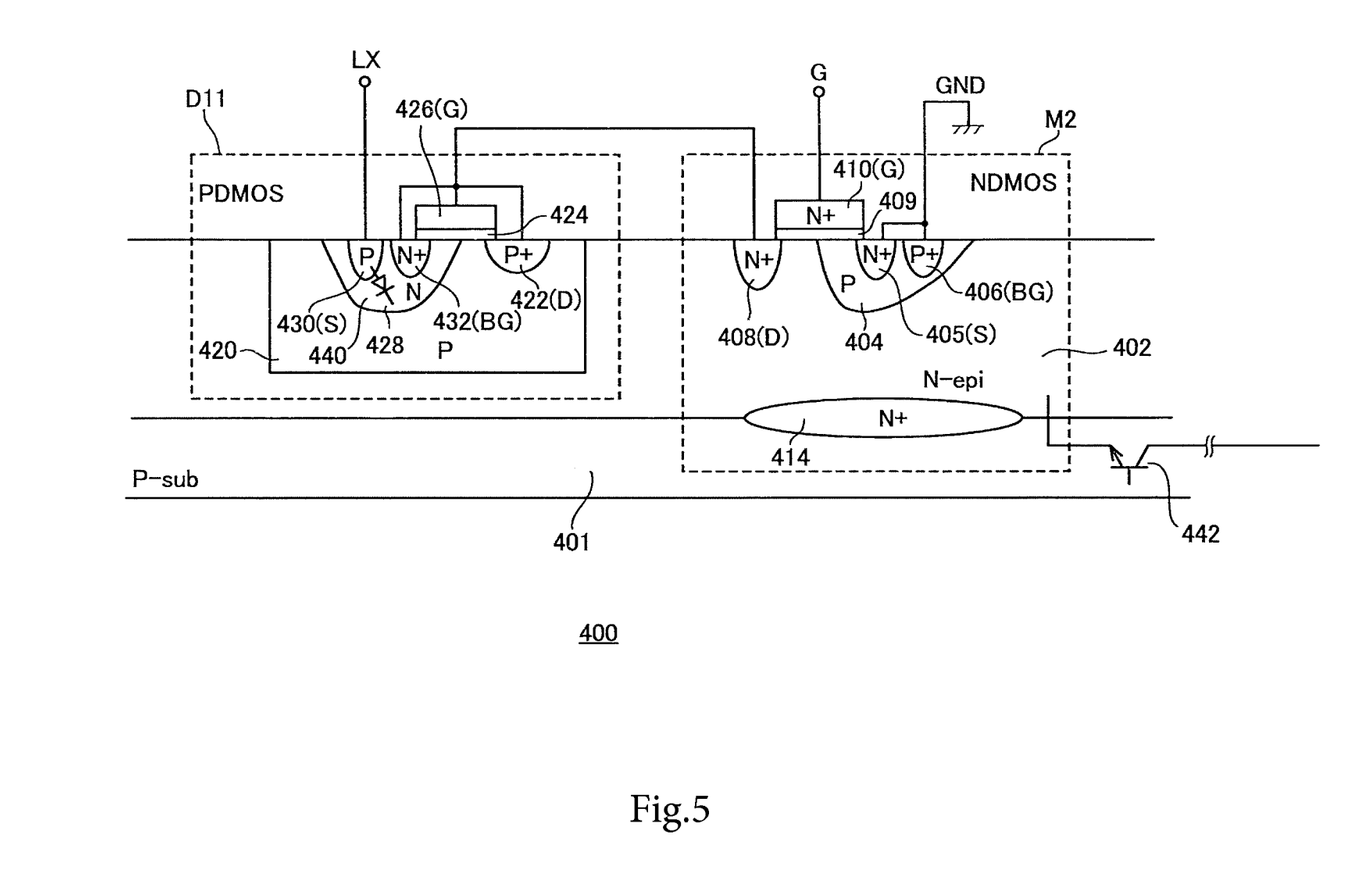
FIG. 5 is a cross-sectional view illustrating the integration of the low-side transistor and the first diode of a semiconductor device.

FIG. 5 is a cross-sectional view illustrating the integration of the low-side transistor M2 and the first diode D11 of the semiconductor device 400. The low-side transistor M2 and the first diode D11 are depicted in FIG. 4.

The structure of the low-side transistor M2 is substantially the same as that depicted in FIG. 2. That is, an N-type epitaxial layer 402 for use as the semiconductor layer is formed on the P-type semiconductor substrate 401. A P-type body diffusion region 404 for use as the body region is formed at the surface layer portion of the N-type epitaxial layer 402. An N-type source diffusion region 405 for use as the source region (S) and a P-type body contact region 406 are formed at the surface layer portion of the P-type body diffusion region 404. The N-type source diffusion region 405 and the P-type body contact region 406 are connected to the ground.

A drain diffusion region 408 for use as the drain region is formed at the surface layer portion of the N-type epitaxial layer 402. An oxide film layer 409 is formed at the gate region on the surface of the N-type epitaxial layer 402, and a gate electrode 410(G) is formed on the oxide film layer 409. An N-type embedded diffusion layer 414 is formed at the injunction of the P-type semiconductor substrate 401 and the N-type epitaxial layer 402.

The first diode D11 is made from the P-channel DMOS transistor (referred to as PDMOS). A P-type diffusion region 420 is formed at the position where the PDMOS resides on the N-type epitaxial layer 402. At the surface layer portion of the P-type diffusion region 420, a P-type diffusion region 422 for use as one terminal (referred to as the drain for the sake of convenience) of the PDMOS is formed. Also, an oxide film layer 424 is formed at the gate region on the surface of the P-type diffusion region 420, and a gate electrode 426(G) is formed on the oxide film layer 424. Further, an N-type body diffusion region 428 is formed at the P-type diffusion region 420, and an N-type body contact region 432(BG) for use as the body contact region and a P-type diffusion region 430 for use as the other terminal (referred to as the source for the sake of convenience) of the PDMOS.

The source (S) of the NDMOS transistor for use as the low-side transistor M2 is connected with the back-gate (BG) and the GND terminal. The gate (G), back-gate (BG), and drain (D) of the PDMOS transistor for use as the first diode D11 are connected with the drain (D) of the low-side transistor M2. The source (S) of the PDMOS transistor is connected with the LX terminal. In this way, the first diode D11 (440), which uses the P-type diffusion region 430 as the anode and the N-type body diffusion region 428 as the cathode, is formed.

The structure of the components of the semiconductor device 400 has been laid out above. The advantages of the semiconductor device 400 are discussed below.

By inserting the first diode D11 that is connected in series with the low-side transistor M2, it is feasible to prevent the drain of the low-side transistor M2 from shifting toward the negative direction even when the potential of the LX terminal shifts toward the negative side. In this way, there is no need to surround the periphery of the N-type epitaxial layer 402 using the guard ring 220 depicted in FIG. 2. As a result, the parasitic transistor 230 shown in FIG. 2 no longer exists, and accordingly, it is feasible to prevent the heavy current from flowing from the parasitic transistor 230 into the low-side transistor M2, which may otherwise jeopardize the reliability of the device.

In the structure depicted in FIG. 5, a parasitic transistor 442 may exist in place of the parasitic transistor 230, in which the parasitic transistor 442 uses the N-type epitaxial layer 402 as the emitting electrode, the P-type semiconductor substrate 301 as the base electrode, and an N-type region (not shown) as the drain. However, since the first diode D11 inhibits the drain (D) of the low-side transistor M2 from shifting toward the negative direction substantially, the parasitic transistor 442 will not be connected.

Further, it is also feasible to use the PDMOS transistor to form the first diode D11, as illustrated in FIG. 5. In this way, it is feasible to manufacture the first diode D11 in a way that the semiconductor substrate 401 for use in the integration of the control IC 200 comprises no parasitic element. In other words, it is feasible to prevent the first diode D11 itself from being the drain of the parasitic transistor 442.

Moreover, the first diode D11 is resistant to high voltage owing to the use of the PDMOS transistor, and accordingly, the present device can be used in applications having a $V_{CC}$ of 24-V series or 48-V series.

Besides, the current via the parasitic transistor 442 will not flow regardless of the potential of the LX terminal. Accordingly, it is feasible to use elements with greater forward voltage Vf as the rectifier diode D1. This is advantageous to the rectifier diode D1, which in turn reduces the cost of the DC/DC converter 100.

Figure 7:
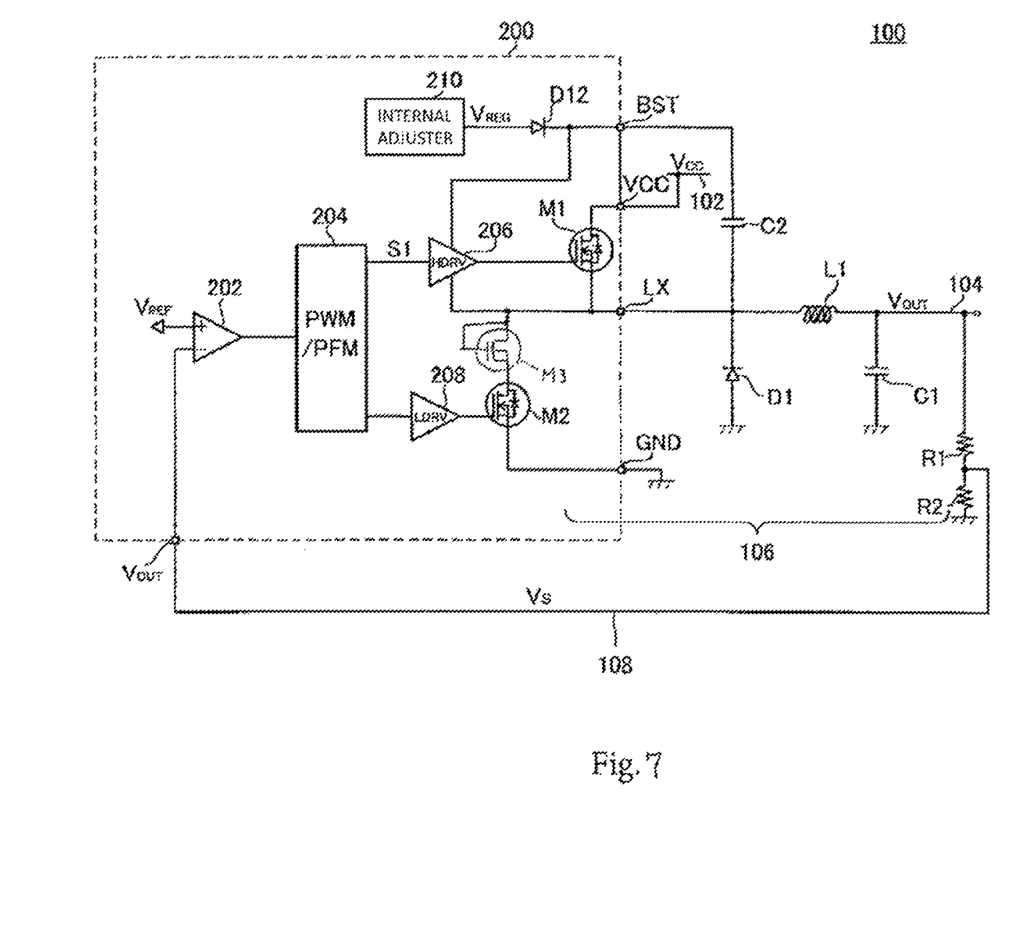
FIG. 7 is a circuit diagram illustrating a buck DC/DC converter according to embodiments of the present invention.

Regarding the control IC 200 in FIG. 3, it should be appreciated that the first diode D11 can be used as a voltage limiting element that inhibits the drain voltage of the low-side transistor M2 from shifting toward the negative direction. In FIG. 3, one example of the voltage limiting element is a diode; in particular, the diode using the PDMOS transistor; however, persons having ordinary skill in the art should understand that the present invention is not limited thereto. For example, as seen in FIG. 7, the voltage limiting element can be made from a floating MOSFET M3.

Figure 6A:
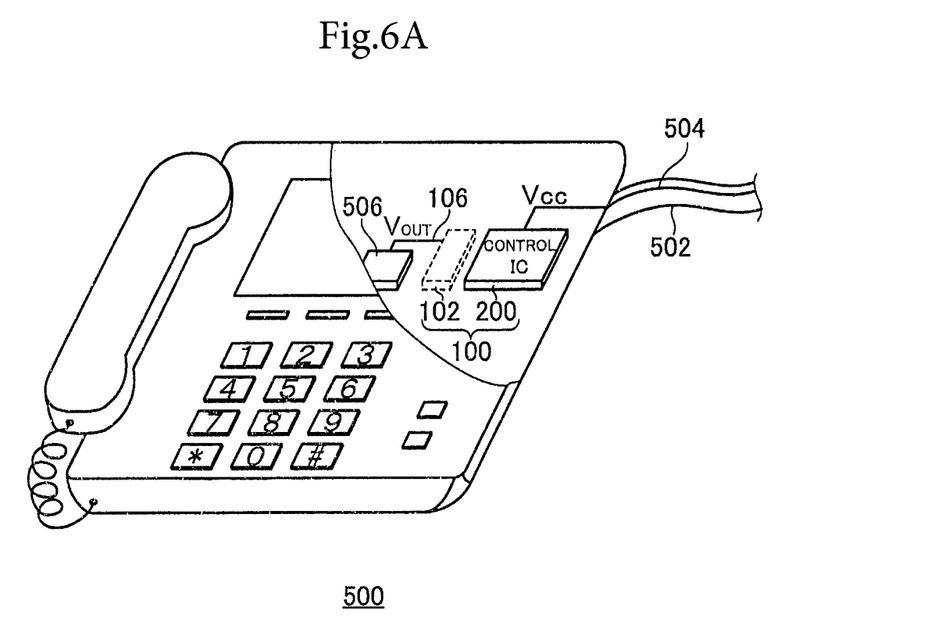
FIG. 6A is a schematic diagram of a communication machine for office having the present DC/DC converter.

Last but not least, discussed hereinbelow are applications in which the DC/DC converter 100 of the control IC 200 can be used. FIG. 6A is a schematic diagram of a communication machine for office 500 having the present DC/DC converter 100. The communication machine for office can be, for example, a telephone set in which the electricity is supplied by a telephone line 502. A power supply voltage $V_{CC}$ of 12-, 24- or 48-V series is supplied to the electric wire 504 in the telephone line 502. The DC/DC converter 100 reduces the power supply voltage $V_{CC}$ to 3.5 V, 5 V or 1.5 V, and then supplies the reduced voltage to a microcontroller 506 used as the load. Alternatively, the communication machine for office can be machines in which the electricity is supplied by the LAN (Local Area Network) cable of the PoE (Power Over Ethernet™).

Figure 6B:
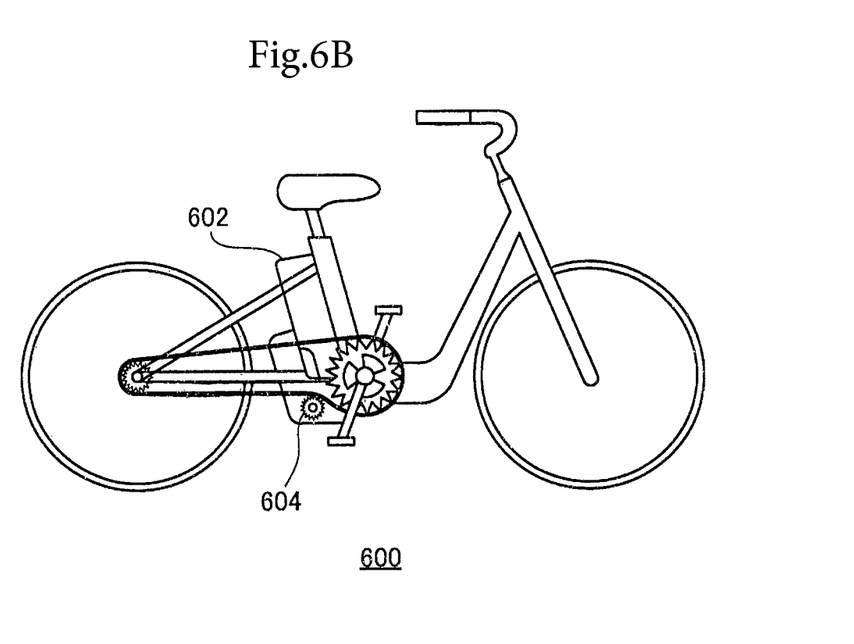
FIG. 6B is a schematic diagram of an electric bicycle having the present DC/DC converter.

FIG. 6B is a schematic diagram of an electric bicycle 600 having the present DC/DC converter 100. The electric bicycle 600 comprises a secondary battery 602, an auxiliary motor 604, a motor driving circuit (not shown) or microcomputer for control (not shown), etc. The DC/DC converter 100 receives and reduces the battery voltage, and then supplies the reduced voltage to the microcomputer or the motor driving circuit. The microcomputer controls the revolution or torque of the auxiliary motor 604 based on the revolution of the crank or pedaling torque.

Moreover, the application of the DC/DC converter 100 is not limited to communication machines for office or electric bicycles; rather, it may be used in, for example, tillage machines for agricultural purposes.

The present invention has been discussed with a certain degree of particularity based on embodiments thereof; however, these embodiments only disclose the principles of the present invention, and the applications of these embodiments allow for various variations or alterations of the configuration without departing from the spirit or scope of this invention as defined by the appended claims.

What is claimed is:

1. A control integrated circuit (IC), characterized by being the control IC of a rectifier diode-type buck DC/DC converter and comprising,
   an input terminal, configured to receive an input voltage;
   a switch terminal, connected with an inductor and connected with a cathode of the rectifier diode;
   a ground terminal, connected with an anode of the rectifier diode;
   an N-channel DMOS switch transistor, disposed between the input terminal and the switch terminal;
   a first diode and an N-channel DMOS low-side transistor, connected in series with and disposed between the switch terminal and the ground terminal;
   a high-side driver, configured to switch the switch transistor; and
   a low-side driver, configured to switch the low-side transistor;
   wherein the first diode comprises a P-channel DMOS transistor.

2. The control IC according to claim 1, wherein the P-channel DMOS transistor comprises a gate and a backgate that are connected with a drain of the low-side transistor.

3. The control IC according to claim 1, wherein the first diode is disposed at a position that is closer to the high side than the low-side transistor is.

4. The control IC according to claim 1, further comprising,
   a bootstrap terminal;
   an internal adjuster, configured to generate an internal voltage with a specified voltage level; and
   a second diode, disposed between the output terminal of the internal adjuster and the bootstrap terminal, and configured to supply the voltage of the bootstrap terminal to the power terminal at the high side of the high-side driver.

5. The control IC according to claim 1, wherein the control IC is configured to receive an input voltage greater than 24-V series.

6. The control IC according to claim 1, further comprising:
   a detection terminal, configured to be inputted with a detection voltage corresponding to the output voltage of the buck DC/DC converter;
   an error amplifier, configured to amplify an error between the detection voltage and a specified reference voltage and generate an error signal; and
   a duty cycle controller, configured to receive the error signal and generate a pulse modulation signal by modulating the duty cycle ratio while the error is close to zero.

7. A buck DC/DC converter, characterized by being the buck DC/DC converter of the rectifier diode-type and comprising,
   the control IC according to claim 1;
   an output line, connected with a load;
   a rectifier diode, disposed between the switch terminal and the ground terminal of the control IC;
   an output capacitor, connected with the output line; and
   an inductor, disposed between the output line and the switch terminal.

8. A communication machine for office, characterized by comprising the buck DC/DC converter in claim 7.

9. An electric bicycle, characterized by comprising the buck DC/DC converter in claim 7.

10. A control IC, characterized by being the control IC of a rectifier diode-type buck DC/DC converter and comprising,
    an input terminal, configured to receive an input voltage;
    a switch terminal, connected with an inductor and connected with a cathode of the rectifier diode;
    a ground terminal, connected with an anode of the rectifier diode;
    an N-channel DMOS switch transistor, disposed between the input terminal and the switch terminal;
    an N-channel DMOS low-side transistor, wherein a source of the low-side transistor is connected with the ground terminal;
    a voltage limiting element, inserted between the switch terminal and a drain of the low-side transistor, and configured to inhibit a drain voltage of the low-side transistor from shifting toward a negative direction;
    a high-side driver, configured to switch the switch transistor; and
    a low-side driver, configured to switch the low-side transistor;
    wherein the voltage limiting element comprises a P-channel DMOS transistor.

11. The control IC according to claim 10, wherein the voltage limiting element comprises a first diode.

12. The control IC according to claim 10, wherein the P-channel DMOS transistor comprises a gate and a backgate that are connected with the drain of the low-side transistor.

13. The control IC according to claim 10, wherein the voltage limiting element comprises a floating MOSFET.

* * * * *